United States Patent
Fink et al.

(10) Patent No.: US 9,823,290 B2
(45) Date of Patent: Nov. 21, 2017

(54) METHOD FOR TESTING COMPONENTS AND MEASURING ARRANGEMENT

(71) Applicant: Infineon Technologies AG, Neubiberg (DE)

(72) Inventors: Franz Fink, Wiesenfelden (DE); Alexander Koelpin, Bamberg (DE); Harald Kuhn, Zeitlarn (DE); Florian Oesterle, Nuremberg (DE)

(73) Assignee: Infineon Technologies AG, Neubiberg (DE)

(*) Notice: Subject to any disclaimer, the term of this patent is extended or adjusted under 35 U.S.C. 154(b) by 535 days.

(21) Appl. No.: 14/197,247

(22) Filed: Mar. 5, 2014

(65) Prior Publication Data
US 2014/0253142 A1    Sep. 11, 2014

(30) Foreign Application Priority Data
Mar. 5, 2013    (DE) .................. 10 2013 102 155

(51) Int. Cl.
*G01R 31/04*    (2006.01)
*G01R 31/01*    (2006.01)

(52) U.S. Cl.
CPC .......... *G01R 31/04* (2013.01); *G01R 31/016* (2013.01)

(58) Field of Classification Search
CPC ..................................................... G01R 31/04
See application file for complete search history.

(56) References Cited

U.S. PATENT DOCUMENTS

| | | | | |
|---|---|---|---|---|
| 6,677,745 B2 * | 1/2004 | Mayr | ................. | G01R 31/3191 |
| | | | | 324/750.02 |
| 6,954,079 B2 | 10/2005 | Sugimoto et al. | | |
| 7,872,487 B2 | 1/2011 | Ross et al. | | |
| 9,207,294 B1 * | 12/2015 | Simon | ................. | G01R 33/1238 |
| 2004/0113642 A1 | 6/2004 | Sugimoto et al. | | |

(Continued)

FOREIGN PATENT DOCUMENTS

| | | |
|---|---|---|
| CN | 1409123 A | 4/2003 |
| CN | 1508556 A | 6/2004 |

(Continued)

OTHER PUBLICATIONS

English Translation of KR20090081612A.*

*Primary Examiner* — Jermele M Hollington
(74) *Attorney, Agent, or Firm* — Viering, Jentschura & Partner mdB

(57) ABSTRACT

In accordance with one embodiment, a method for testing a plurality of electronic components is provided, including subdividing the plurality of electronic components into a plurality of first groups and subdividing the plurality of electronic components into a plurality of second groups. The method may further include measuring, for each first group, an electrical parameter of an interconnection of the components of the first group; measuring, for each second group, an electrical parameter of an interconnection of the components of the second group, and determining which electronic components of the plurality of electronic components have a predefined property, on the basis of the result of the measurement of the electrical parameter for the first groups and on the basis of the result of the measurement of the electrical parameter for the second groups.

20 Claims, 15 Drawing Sheets

(56) References Cited

U.S. PATENT DOCUMENTS

2005/0060622 A1     3/2005   Clark et al.
2009/0189629 A1     7/2009   Ross et al.
2011/0246121 A1   10/2011   Bairo

FOREIGN PATENT DOCUMENTS

| CN | 101303384 A | 11/2008 | |
|---|---|---|---|
| DE | 69633713 T2 | 2/2006 | |
| DE | 102007062711 A1 | 7/2009 | |
| DE | 102013102155 A1 | 9/2014 | |
| EP | 0786667 A2 | 7/1997 | |
| KR | 20090081612 A * | 7/2009 | ............. G01R 31/00 |

* cited by examiner

FIG 7
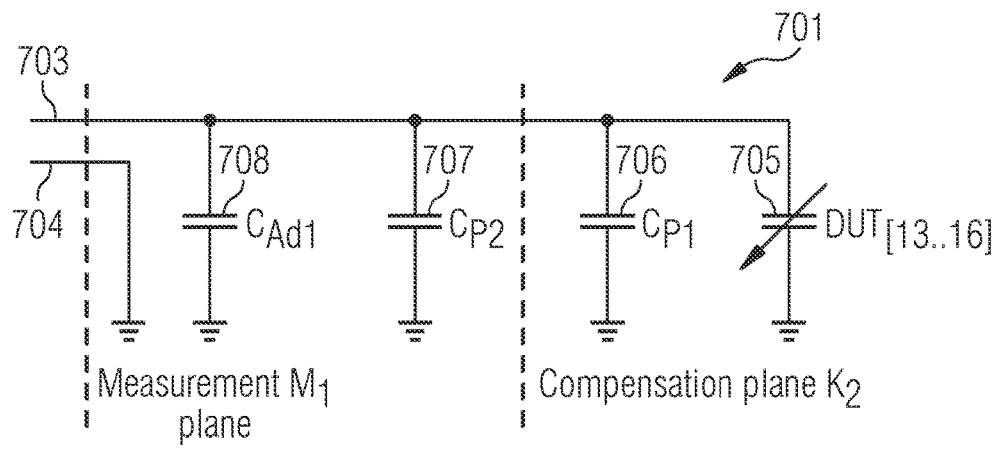
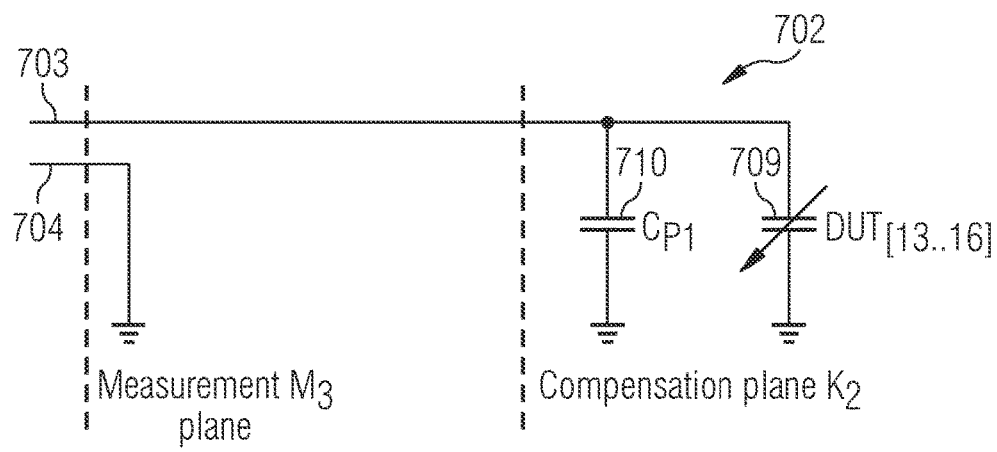

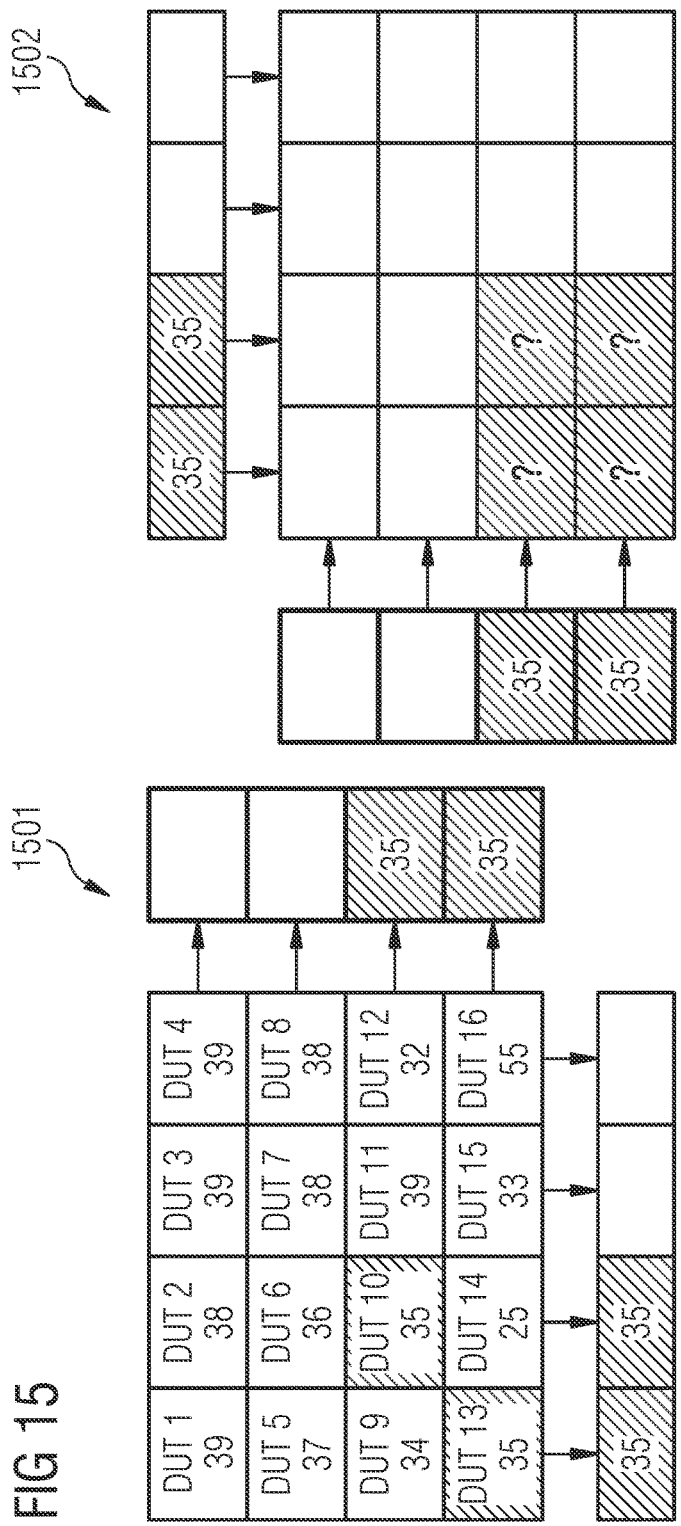

METHOD FOR TESTING COMPONENTS AND MEASURING ARRANGEMENT

CROSS-REFERENCE TO RELATED APPLICATION

This application claims priority to German Patent Application Serial No. 10 2013 102 155.7, which was filed Mar. 5, 2013, and is incorporated herein by reference in its entirety.

TECHNICAL FIELD

Various embodiments generally relate to methods for testing components and measuring arrangements.

BACKGROUND

Since electrical components produced can be defective or can vary at least in their properties, electrical components are typically tested after they have been produced. Since every instance of carrying out and evaluating a measurement causes costs, efficient test methods requiring a small number of measurement and evaluation processes, for example, are desirable.

SUMMARY

In accordance with one embodiment, a method for testing a plurality of electronic components is provided, including subdividing the plurality of electronic components into a plurality of first groups and subdividing the plurality of electronic components into a plurality of second groups. The method may further include measuring, for each first group, an electrical parameter of an interconnection of the components of the first group; measuring, for each second group, an electrical parameter of an interconnection of the components of the second group, and determining which electronic components of the plurality of electronic components have a predefined property, on the basis of the result of the measurement of the electrical parameter for the first groups and on the basis of the result of the measurement of the electrical parameter for the second groups.

In accordance with various embodiments, a measuring arrangement in accordance with the test method described above is provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 7 shows a circuit as a model for an individual measurement and a circuit as a model for a parallel measurement.

FIG. 15 shows DUT matrices.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The following detailed description refers to the accompanying figures showing details and embodiments. These embodiments are described in sufficient detail to enable a person skilled in the art to implement the invention. Other embodiments are also possible and the exemplary embodiments can be modified from a structural, logical and electrical standpoint, without departing from the subject matter of the invention. The different embodiments are not necessarily mutually exclusive, rather different embodiments can be combined with one another, thus giving rise to new embodiments.

Figure 1:
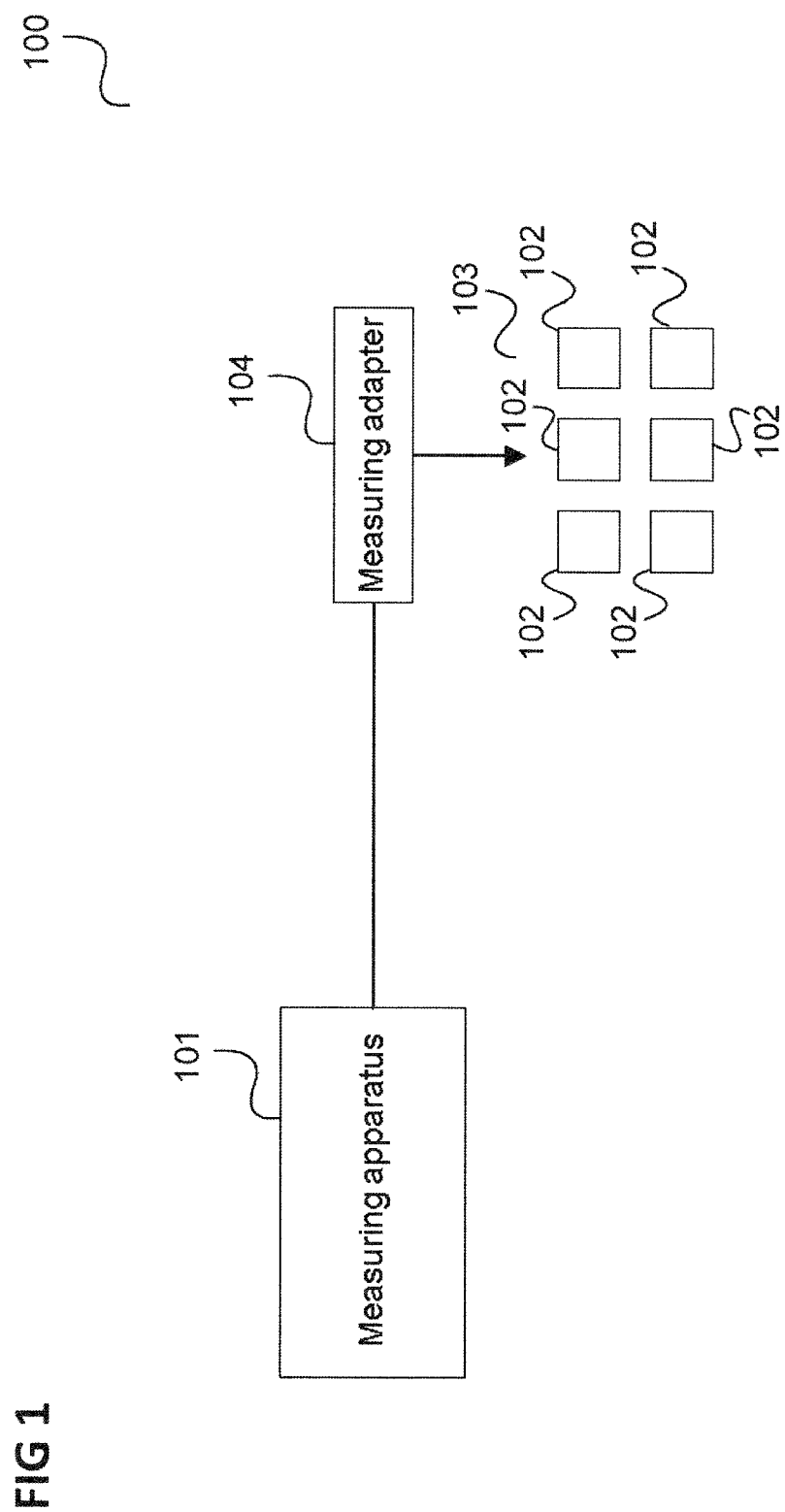
FIG. 1 shows a test arrangement in accordance with various embodiments.

FIG. 1 shows a test arrangement 100 in accordance with various embodiments.

The test arrangement (or measurement arrangement) 100 includes a measuring apparatus 101, which serves for testing a plurality of elements to be tested (also designated hereinafter as DUTs, standing for devices under test) 102. In this example, the DUTs 102 are arranged in a matrix geometry 103, designated hereinafter as matrix, (or in a different scheme). DUTs hereinafter are, for example, individual (electrical or electronic) components or devices. The measuring apparatus 101 is coupled to a measuring adapter 104, for example a needle card, by means of which the DUTs 102 can be contacted and measured.

DUTs can be detected (i.e. contacted and measured) individually or else in joint parallel form, by means of the DUTs 102 being treated as individual parts during the contacting. During the measurement, each DUT (e.g. each device to be measured) is detected and measured by the measuring apparatus 101. In the case where a plurality of DUTs 102 are contacted simultaneously, there are two possibilities. In one procedure, each DUT 102 is led to an individual measuring instrument 101 and the quantity of parallel measuring instruments 101 can be used to measure a corresponding number of DUTs 102 simultaneously. In this case, the number of measuring instruments 101 required corresponds to the number of DUTs 102 contacted in parallel and can become extremely cost-intensive as a result. In the other procedure, the DUTs 102 contacted in parallel are led via a multiplexer to an individual measuring apparatus 101, which leads to the loss of the simultaneity of the measurement.

In accordance with one embodiment, a test method is provided which makes it possible to avoid a high investment in the duplication of test installations or measuring stations and the measuring instruments thereof while at the same time increasing the number of components to be tested (DUTs) per unit time.

Figure 2:
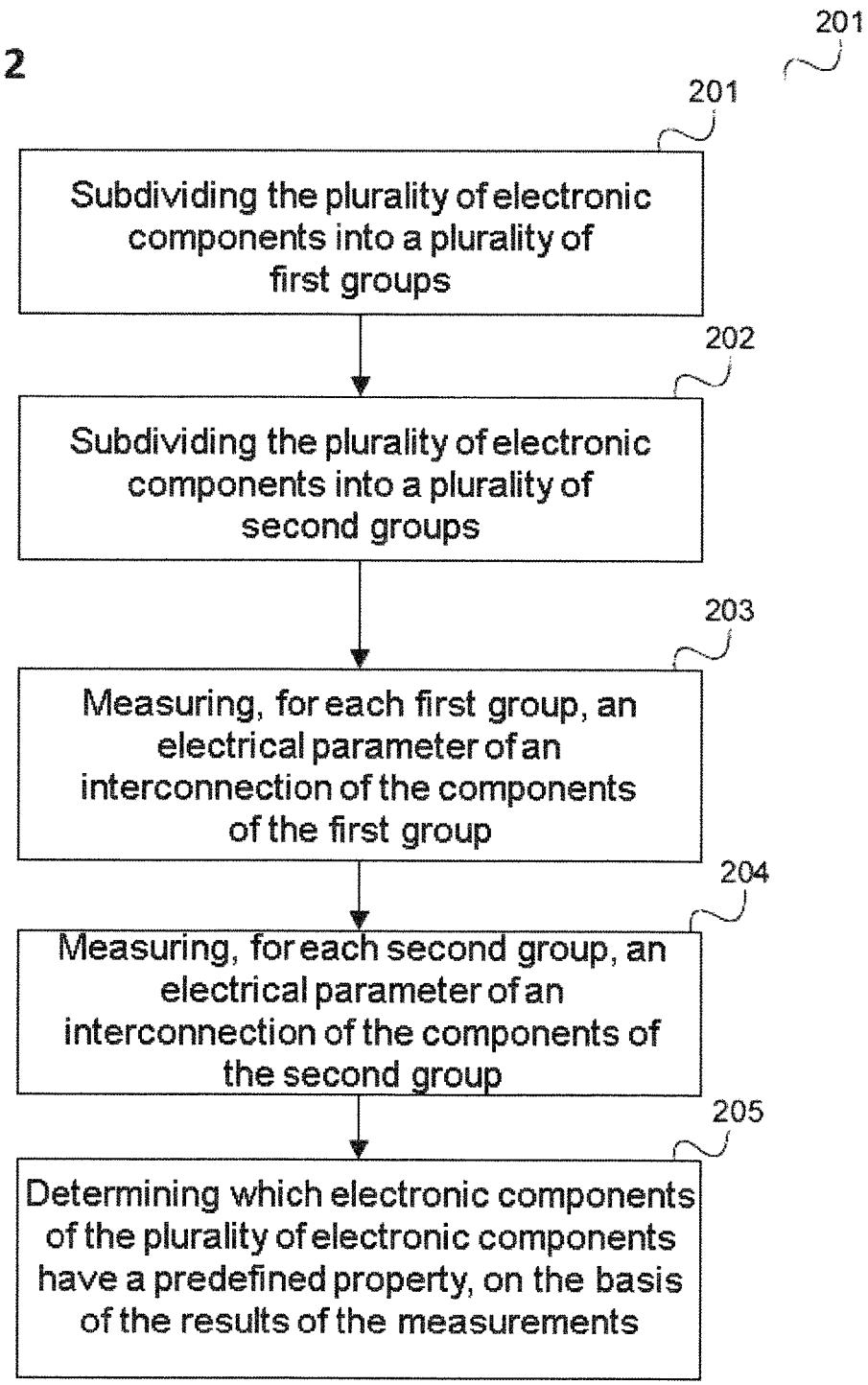
FIG. 2 shows a flow chart in accordance with various embodiments.

FIG. 2 shows a flow chart 200 in accordance with various embodiments.

The flow chart 200 illustrates a method for testing a plurality of electronic components (with regard to a predefined, for example electrical, property).

201 involves subdividing the plurality of electronic components into a plurality of first groups.

202 involves subdividing the plurality of electronic components into a plurality of second groups.

203 involves measuring, for each first group, an electrical parameter of an interconnection of the components of the first group.

204 involves measuring, for each second group, an electrical parameter (for example the same electrical parameter or a different electrical parameter) of an interconnection of the components of the second group.

205 involves determining which electronic components of the plurality of electronic components have a predefined property, on the basis of the result of the measurement of the electrical parameter for the first groups and on the basis of the result of the measurement of the electrical parameter for the second groups.

In other words, a plurality of parallel tests are carried out for a plurality of components (i.e. DUTs), wherein the parallel tests are carried out for different subdivisions of the components into groups, such that a statement about individual components can be made by combining the results. By way of example, a matrix test, i.e. a test of components which are arranged (at least virtually) in a matrix, is carried out by a procedure in which parallel measurements of components situated in the same row and parallel measurements of components situated in the same column are carried out and individual components having a specific property (e.g. defective components) are identified by the measurement results being combined.

The subdivision into the first groups and into the second groups can occur implicitly by corresponding interconnection of components during the measurement or by corresponding control of the measuring device or measuring arrangement.

By way of example, a multiplicity of processed components (DUTs) are measured simultaneously in order to identify defective functionality on account of potential production faults. In this case, the DUTs are arranged for a defined superposition of electrotechnical characteristic variables with the aim of simultaneously meteorologically detecting the corresponding test parameters of said DUTs. Furthermore, for example, said test parameters are subsequently correlated for a necessary assignment of measured values that are outside the specification to thus defective DUTs. Especially for products which have to be tested 100 percent and the processing of which from a technological standpoint has to have a high stability and thus a low probability of functional process faults, this procedure can enable a high cost saving.

By way of example, determining which electronic components of the plurality of electronic components have a predefined property includes: determining, for each first group, on the basis of the result of the measurement of the electrical parameter for the first group, whether the first group contains a component having the predefined property, and, if the first group contains a component having the predefined property, identifying the component of the first group having the predefined property on the basis of the result of the measurement of the electrical parameter for the second groups.

Identifying the component of the first group having the predefined property on the basis of the result of the measurement of the electrical parameter for the second groups includes, for example: determining, for each second group, on the basis of the result of the measurement of the electrical parameter for the second group, whether the second group contains a component having the predefined property, and identifying the component of the first group as a component contained in a second group for which it was determined that the latter contains a component having the predefined property.

The components are subdivided for example completely into the first groups and completely into the second groups, i.e. each component is allocated to one of the first groups and to one of the second groups.

In accordance with various embodiments, each first group differs from each second group.

By way of example, each first group has at most one component, for example exactly one component, in common with each second group.

The components are arranged for example in a manner corresponding to a matrix (e.g. on a wafer), and the first groups correspond to the rows of the matrix and the second groups correspond to the columns of the matrix. However, this need not be a complete rectangular matrix. The components can also be arranged differently in rows and columns, for example so as to result in a circle (e.g. in the case of a round wafer).

The interconnection is a parallel connection or a series connection, for example.

In accordance with various embodiments, the method may include: measuring, for each first group, the profile of an electrical parameter of an interconnection of the components of the first group depending on an electrical variable; measuring, for each second group, the profile of an electrical parameter of an interconnection of the components of the second group depending on an electrical variable; and determining which electronic components of the plurality of electronic components have a predefined property, on the basis of the result of the measurement of the profile of the electrical parameter for the first groups and on the basis of the result of the measurement of the profile of the electrical parameter for the second groups.

In accordance with various embodiments, determining which electronic components of the plurality of electronic components have a predefined property comprises: determining a test parameter value, and assigning the test parameter value to a component.

By way of example, a component has the predefined property if the test parameter value assigned to the component lies within a predefined range.

The electrical parameter measured for the first groups and the electrical parameter measured for the second groups are the same electrical parameter, for example.

The electrical parameter measured for the first groups or the electrical parameter measured for the second groups or both is or are for example a resistance of the interconnection, the capacitance of the interconnection, the inductance of the interconnection, the impedance of the interconnection, a phase shift of the interconnection or a frequency shift of the interconnection.

The test parameter value is for example the value of a pull-in voltage, of a threshold voltage or of a resonant frequency.

The predefined property is for example that the component fulfills a predefined functional specification (for example that it is functional).

The method may for example furthermore include subdividing the plurality of electronic components into a plurality of further groups; measuring, for each further group, an electrical parameter of an interconnection of the components of the further group; and determining which electronic components of the plurality of electronic components have a predefined property, on the basis of the result of the measurement of the electrical parameter for the first groups, on the basis of the result of the measurement of the electrical parameter for the second groups and on the basis of the result of the measurement of the electrical parameter for the further groups.

By way of example, subdividing into the further groups and measuring the electrical parameter of an interconnection of the further group (and correspondingly determining on the basis thereof) are carried out if it has been ascertained that, on the basis of the result of the measurement of the electrical parameter for the first groups and on the basis of the result of the measurement of the electrical parameter for the second groups, it cannot be determined unambiguously which electronic components of the plurality of electronic components have a predefined property. If necessary for an unambiguous determination, even further subdivisions and corresponding measurements can be carried out.

Figure 3:
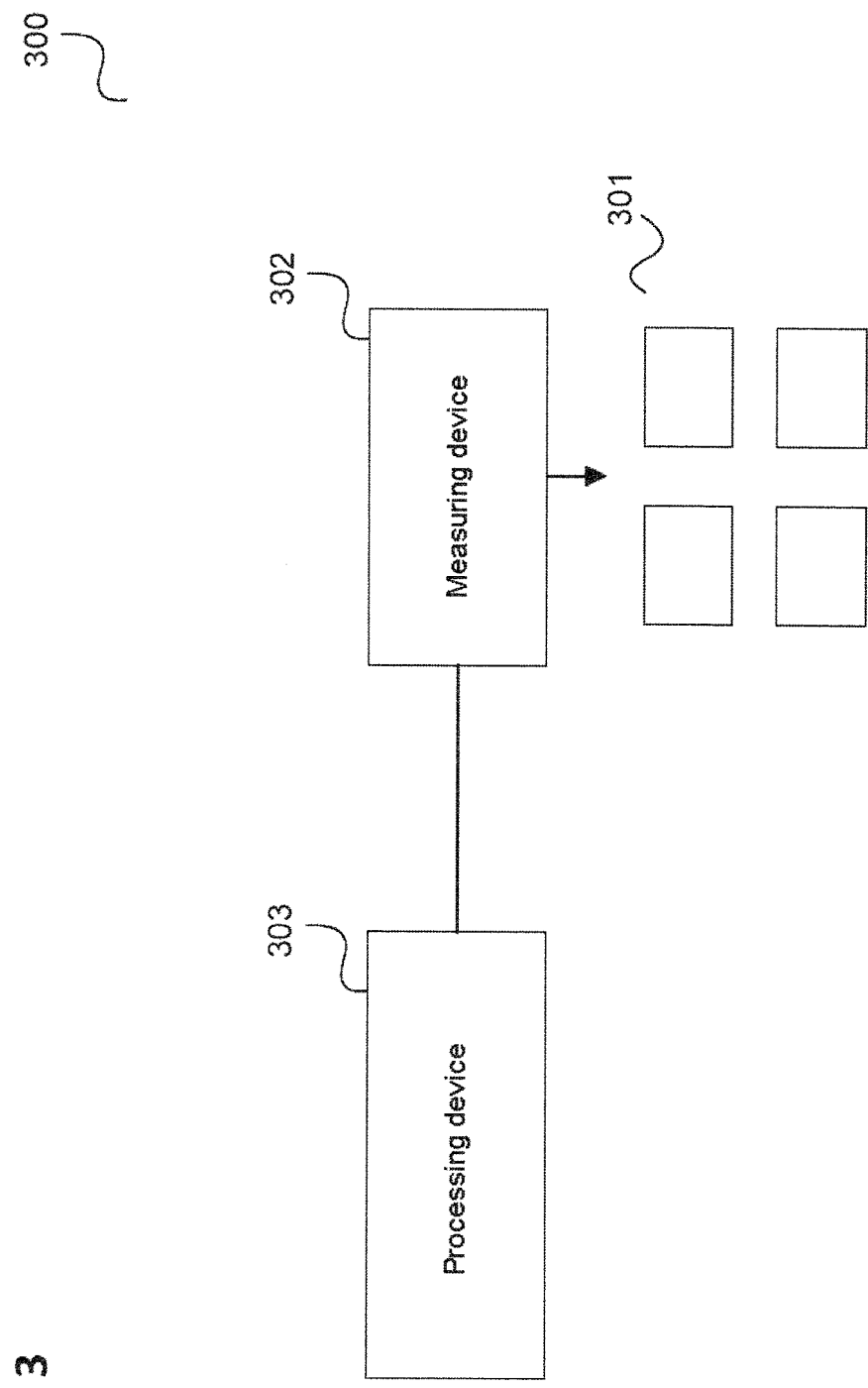
FIG. 3 shows a measuring arrangement in accordance with various embodiments.

The method illustrated in FIG. 2 is carried out for example by a test arrangement such as is illustrated in FIG. 3.

FIG. 3 shows a measuring arrangement 300 in accordance with various embodiments.

The measuring arrangement 300 includes a plurality of electronic components 301 to be measured.

The measuring arrangement 300 furthermore includes a measuring device 302, which is designed to measure for each first group, in accordance with a subdivision of the plurality of electronic components into a plurality of first groups, an electrical parameter of an interconnection of the components of the first group, and to measure for each second group, in accordance with a subdivision of the plurality of electronic components into a plurality of second groups, an electrical parameter of an interconnection of the components of the second group.

In addition, the measuring arrangement 300 includes a processing device 303, which is designed to determine, on the basis of the result of the measurement of the electrical parameter for the first groups and on the basis of the result of the measurement of the electrical parameter for the second groups, which electronic components of the plurality of electronic components have a predefined property.

The components of the measuring arrangement 300, for example the measuring device 302 and the processing device 303, can be implemented by one or more circuits.

In various embodiments, a "circuit" should be understood as any unit which implements a logic and which can be either hardware, software, firmware or a combination thereof. Consequently, a "circuit" in one embodiment can be a hardwired logic circuit or a programmable logic circuit, such as, for example, a programmable processor, e.g. a microprocessor. A "circuit" can also be understood to mean a processor which executes software, e.g. any kind of computer program, for instance a computer program in programming code. In one embodiment, a "circuit" can be understood as any kind of implementation of the functions described below.

Embodiments mentioned in connection with the method illustrated in FIG. 2 are analogously applicable to the measuring arrangement 300, and vice versa.

The method illustrated in FIG. 2 is explained below on the basis of the example of capacitive MEMS sensors (MEMS (microelectromechanical systems) sensors) as DUTs 102.

The purely electrotechnical testing of microelectromechanical components such as MEMS sensors as DUTs 102 requires, on account of the mechanical components of the DUTs 102, more demanding techniques than those used for purely electrotechnical components. As an essential parameter, the sensitivity of the DUT 102 to the physical, external variable to be sensed is of importance since it correlates directly with the later functionality of the component. For such a test, the DUT 102 is excited with the physical variable ideally at different operating points, the generally electrical output signal is read out and the resulting sensitivity is determined therefrom. For a test in mass production, although such a method is conceivable, it is very complex and time-intensive, and so there is a desire for a purely electrically based variant. Depending on the type of sensor, this desire can be satisfied in the case of capacitive MEMS since, as a result of the capacitive coupling of mechanical to electrotechnical domain of the sensor, there is generally the possibility of utilizing the bidirectional effect. There is the possibility, with the aid of an applied electrostatic field, of ideally appreciably deflecting the mechanical elements and thereby in turn altering the capacitance of the sensor itself. The result is a sensor-typical characteristic curve, that is to say a device capacitance dependent on the applied electrical voltage, which yields a direct conclusion regarding the sensitivity of the domain-coupling element.

In order to prevent possible influences of process fluctuations in semiconductor production on the device at the desired operating point, the device design can be established such that the parameter to be detected of the MEMS sensor does not vary or varies only minimally. In order then to achieve an increased sensitivity of the test parameter to a possible process fluctuation or even device defects, the device in this case can be tested in the large signal and it is possible to detect a resulting nonlinear effect with high sensitivity to process and thus device quality. This effect corresponds to a jump in the capacitance (pull-in effect) at a voltage to be tested (pull-in voltage). A detailed sensitivity analysis is dependent on the used process steps of the respective technology and the possible fluctuations resulting therefrom and is therefore specifically examined for example with regard to the respective resulting fault record of the specific device.

In the following example, on the basis of the example of capacitive MEMS sensors as DUTs, exclusively the height of the sacrificial layer and the resultant spacing of the capacitively coupled electrodes is assumed as process fluctuation and thus as cause of changed pull-in voltages. Further possible varying device parameters such as, for example, a changed intrinsic tensile stress of the mechanical elements or possible drifts in the geometrical dimensions thereof are assumed to be fixed. For specific applications, the influences thereof on the measurement parameter can be examined. The additionally required test parameters for determining this process fluctuation, such as, for example, mechanical resonant frequencies with regard to MEMS elements, can then, if appropriate, likewise be carried out analogously to the method described below.

Firstly, the measuring method for detecting the capacitive sensor characteristic curve and the large-signal instability of an MEMS sensor is discussed below. Specifically, the measuring instrument parameters and the compensation methods employed, for example, are explained, which are used, for example, on account of the small complex impedance to be measured.

A compensation enables the combination of measurement data generated by means of different measuring adapters 104 and enables parallel measurements even without cost-intensive hardware design.

In order to parallelize an impedance measurement of a multiplicity of devices 102 as explained below, it is possible to use any measuring method for an individual component 102, as long as it is possible to realize the dynamic range and resolution of the measurement for the increased measured values in parallel operation in a sufficient form.

The complex impedance of a device results according to $$Z = R + jX \quad (1)$$

from the sum of the complex portion X and the real portion R. By means of $$C = \frac{-1}{2\pi f_Z \text{Im}(Z)} \quad (2)$$

it is possible to calculate the capacitance C of an ideal capacitor at the measurement frequency $f_Z$ used; the possible inductive portion can be disregarded.

Figure 4:
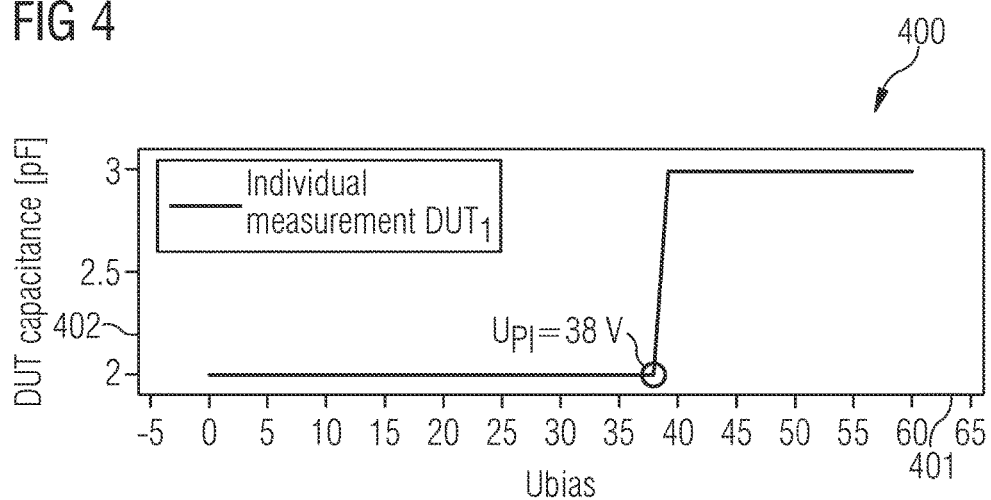
FIG. 4 shows an impedance diagram.

One example of an impedance profile of a device 102 is illustrated in FIG. 4.

FIG. 4 shows an impedance diagram 400.

The voltage at the device (also designated as bias voltage $U_{bias}$) increases from left to right along a voltage axis 401, and the impedance increases from bottom to top along an impedance axis 402.

In order to be able to analyze individual measurements carried out with different adapters comparatively with a measurement of parallel devices, measurements can be transformed to a jointly valid real compensation plane.

Figure 5:
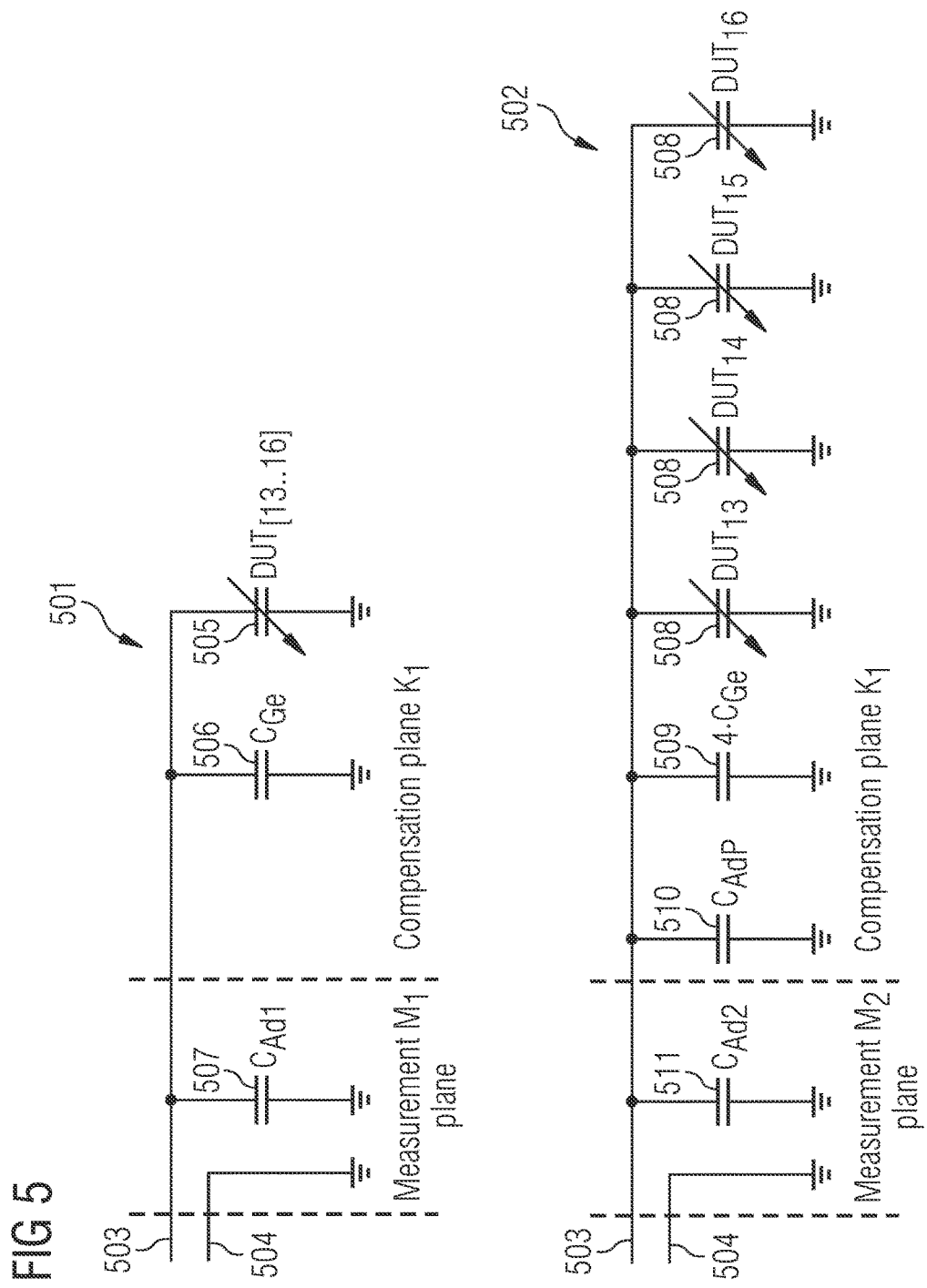
FIG. 5 shows a circuit as a model for an individual measurement and a circuit as a model for a parallel measurement.

FIG. 5 shows a first circuit 501 as a model for an individual measurement and a second circuit 502 as a model for a parallel measurement.

The first circuit 501 and the second circuit 502 model, for example, the circuit parts of the measuring arrangement 100 including the DUT(s) 102 and the measuring adapter 104 up to the connections of the measuring adapter 104 to the measuring apparatus 101, which in the circuits 501, 502 correspond for example to a first connection 503 and a second connection 504, wherein in this example the second connection is simply coupled to a grounding connection (or generally a reference potential) or a grounding line (or a reference potential line).

In order to explain the compensation of parasitic capacitances, it is assumed in this example that the four DUTs (designated as DUTs [13, . . . , 16]) are already housed.

The first circuit 501 has a first capacitance 505 corresponding to the capacitance of the measured DUT 102, a second capacitance 506 corresponding to the capacitance of the housing of the DUT $C_{Ge}$, and a third capacitance 507 corresponding to the capacitance of the parasitic measuring adapter 104 for an individual measurement, which are arranged in parallel between the first connection 503 and respective grounding connections.

The second circuit has fourth capacitances 508 corresponding to the capacitances of the DUTs 102 involved in the parallel measurement, a fifth capacitance 509 corresponding to the total capacitance of the housings of the DUTs 102, a sixth capacitance 510 corresponding to the capacitance of an additional adapter for parallelization $C_{AdP}$, and a seventh capacitance 511 corresponding to the parasitic capacitance of the measuring adapter 104 for a parallel measurement $C_{Ad2}$, which are arranged in parallel between the first connection 503 and respective grounding connections.

For the individual measurement, the parasitic capacitance of the adapter $C_{Ad1}$ and, for the parallel measurement, the capacitances of the adapter $C_{Ad2}$ are compensated for by a measurement without devices. For this first analysis, the capacitance of the device housings $C_{Ge}$ is not compensated for, but rather constitutes a constant capacitance deviation which affects both measurements and thus has no relevant influence for the following comparative analysis. Since the capacitance of an additional adapter for parallelization $C_{AdP}$ is assumed to be very low in comparison with the nominal measurement variable, this compensation is initially disregarded.

The capacitance profiles for individual measurements and parallel measurement can be compensated for with the aid of this procedure.

By way of example, the compensation makes it possible to reduce a deviation between a summation of individual measurements in relation to a direct parallel measurement to the capacitance of the additional measuring adapter $C_{AdP}$ not yet taken into account.

Figure 6:
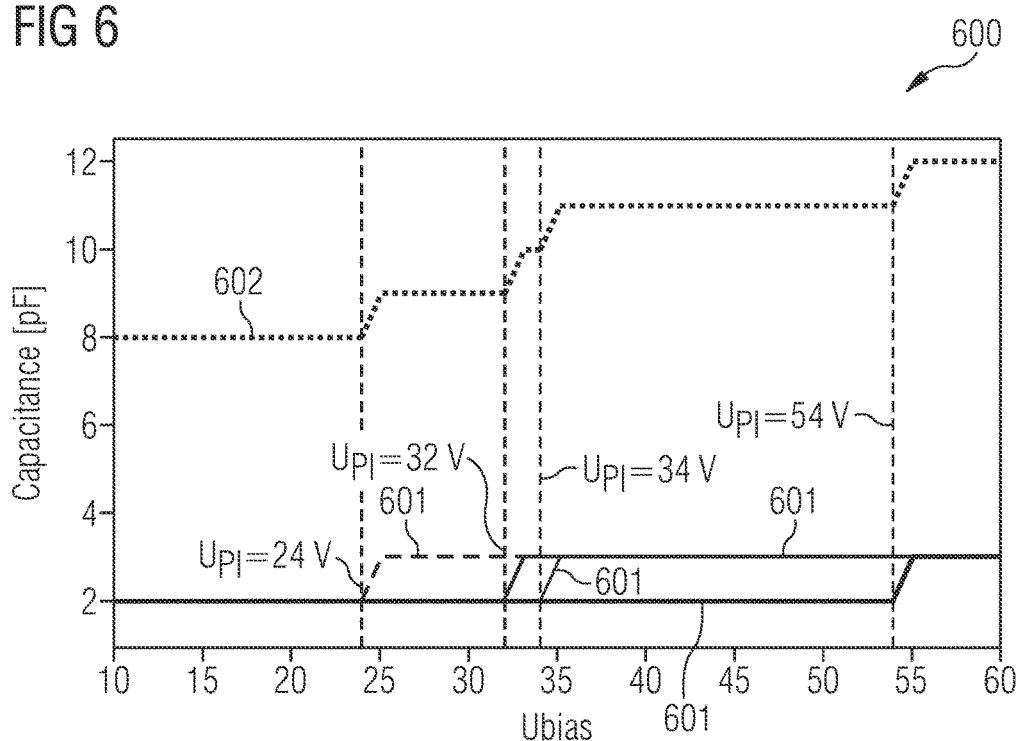
FIG. 6 shows a capacitance diagram.

A comparison of the summation of the individual measurements with the parallel measurement also shows a correspondence of the pull-in voltages of the respective devices between the individual measurement and the parallel measurement and thus the validity of the parallel testing of the capacitive devices. The aim of the compensation of individual and parallel measurements is the verification of the fault-free detection possibility for each pull-in voltage in the case of the direct meteorological parallel connection of a multiplicity of components. FIG. 6 shows the correspondence of the pull-in voltages for both variants on the basis of an exemplary measurement of components DUT13, DUT14, DUT15 and DUT16 according to the measurement and compensation principle described.

FIG. 6 shows a capacitance diagram 600.

In the capacitance diagram 600, first curves 601 show the capacitance profiles of individual measurements for four MEMS sensors, and a second curve 602 shows the capacitance profile of the direct parallel measurement.

Besides the good correspondence between compensated parallel measurement and summation of the individual measurements, the capacitance diagrams 600 reveals that, taking account of the compensation model explained, it is possible to parallelize the individual measurements in the post-processing. For the below-described various embodiments containing the mass parallel testing of components, it is thus possible to create virtual parallel connections of arbitrary components in the post-processing. As a result, firstly no additional costs are incurred for a prototypical design with which the potential of the below-described exemplary embodiment can be demonstrated using specifically produced multi-contact needle cards for direct wafer contacting and the corresponding electronic circuit.

Following the above-described verification of the method for measuring the real and virtual parallel connection of four exemplary housed components, an example for the result of a measurement series for a further twelve devices is explained below. In this case, firstly a further compensation step for corresponding twelve individual device measurements is discussed and an exemplary assumption is made for the differentiation of functional devices and defective, poor devices, and various embodiments for the detection of defective DUTs in a parallel test are described afterward.

For the following explanation, an example of a measurement of the housed devices DUT[13 . . . 16] already used in the example above and a further twelve devices (DUT[1 . . . 12]), which are arranged for example jointly on one chip, is used hereinafter.

In order to be able to use measurements from different measurement versions and pad contacting methods for joint examinations, by way of example, specific devices (in this example the already housed devices DUT[13 . . . 16]) are additionally compensated for relative to the other devices DUT[1 . . . 12].

Corresponding models are illustrated in FIG. 7.

FIG. 7 shows a first circuit 701 as a model for an individual measurement and a second circuit 702 as a model for a parallel measurement.

In this example, the first circuit 701 models the circuit parts of the measuring arrangement 100 including the DUTs [13 . . . 16] and the measuring adapter 104 up to the connections of the measuring adapter 104 to the measuring apparatus 101, which in the circuits 701, 702 correspond for example to a first connection 703 and a second connection 704, wherein in this example the second connection is simply coupled to a grounding connection or a grounding line.

In this example, the second circuit 702 models the circuit parts of the measuring arrangement 100 comprising the DUTs [1 . . . 12] and the measuring adapter 104 up to the connections of the measuring adapter 104 to the measuring apparatus 100, wherein in this example it is assumed that it is possible to disregard the capacitance of the measuring adapter 104 for measuring the on-chip DUTs [1 . . . 12].

The first circuit 701 has a first capacitance 705 corresponding to the capacitance of the DUTs [13 . . . 16], a second capacitance 706, which models an uncertain capacitance deviation and can be disregarded, a third capacitance 707 including, for example, the capacitance of the housings of the DUTs [13 . . . 16], and a fourth capacitance 708 corresponding to the capacitance of the parasitic measuring adapter 104 for the measurement of the DUTs [13 . . . 16], which are arranged in parallel between the first connection 703 and respective grounding connections.

The second circuit 702 has a fifth capacitance 709 corresponding to the capacitances of the DUTs [1 . . . 12], and a sixth capacitance 710, which models an uncertain capacitance deviation and can be disregarded, which are arranged in parallel between the first connection 503 and respective grounding connections.

In accordance with the circuit models illustrated in FIG. 7, by way of example, the measurements for the housed devices DUTs [13 . . . 16] (in addition to the adapter capacitance) are compensated for by the third capacitance 707 $C_{P2}$ in a further post-processing step.

The parasitic portion $C_{P1}$ (of the capacitances 706, 710) that still remains constitutes an uncertain capacitance deviation, which is disregarded, however, since the nominal magnitude of a constant deviation has no influence on the detection of the pull-in voltage.

Figure 8:
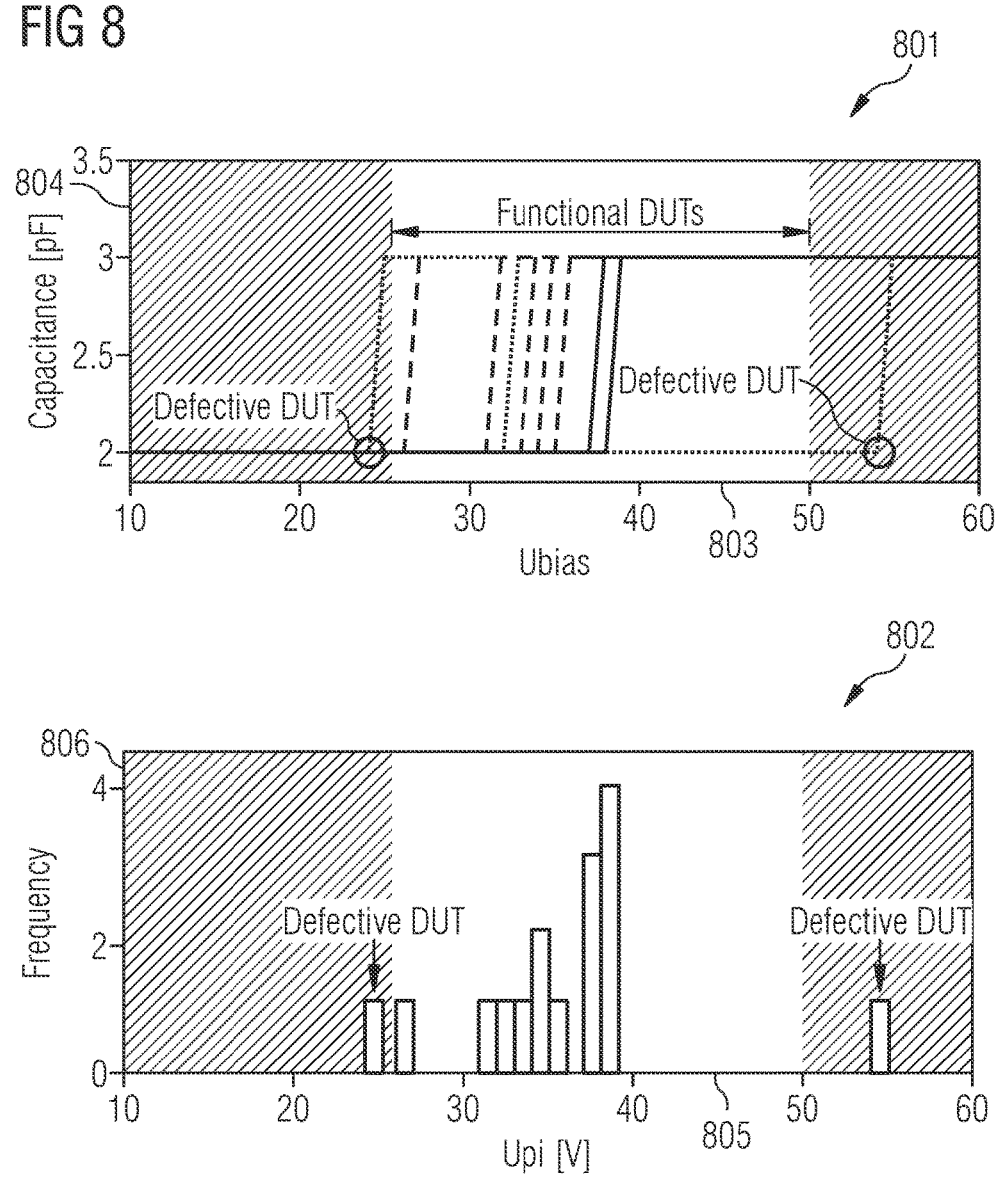
FIG. 8 shows a capacitance diagram and a histogram.

Examples of characteristic curves—arising by means of such a compensation—of all the devices DUT[1 . . . 16] of the measurement series that are measured in this example are illustrated in FIG. 8.

FIG. 8 shows a capacitance diagram 801 and a histogram 802.

In the capacitance diagram 801, the voltage increases from left to right along a respective voltage axis 803, and the capacitance increases from bottom to top along a respective capacitance axis 804. The capacitance diagram 801 provides an overview of the characteristic curves in the range around the pull-in voltages of [10 . . . 60] volts.

In the histogram 802, increasing values of the pull-in voltage are plotted from left to right along a voltage axis 805 and the frequency with which a specific pull-in voltage occurred in a DUT is plotted in a manner increasing along a frequency axis 806. The histogram 803 thus shows an evaluation of the pull-in voltage distribution, wherein the occurrence of defective DUTs is identified.

It is assumed that all devices having a pull-in voltage within a tolerance range of [26 . . . 50] volts fulfill the specification of an exemplary test, while all pull-in voltages outside this range are allocated to defective devices.

According to this test specification, the measurement series in accordance with FIG. 8 contains two defective DUTs, DUT14 having a pull-in voltage of 25 V and DUT16 having a pull-in voltage of 55 V.

In accordance with various embodiments, the identification of defective devices is accelerated (and a cost saving is correspondingly achieved) by a procedure in which, instead of a multiplicity of individual measurements, all the DUTs 102 to be measured are measured in parallel in one step and the pull-in voltages of all the devices 102 are identified from this test. The fact that this is possible in principle is evident from the explanations above, for example concerning FIG. 6.

However, a simple parallelization typically does not enable the assignment of the individual pull-in voltages to the corresponding DUTs, since the detection of a test parameter outside the specification by itself does not yield enough meaningfulness for the conclusion about the specific defective DUT of the parallel measurement. In order to identify a defective DUT, the exact spatial position (within the DUT matrix 103 measured in parallel) of the defective DUT analyzed from the parallel measurement is determined, as described below.

The identification is based, for example, on a defined arrangement of the DUTs in matrix form (or some other predefined scheme) and additional information thereby made possible about the exact position of the defective DUTs at the level of this arrangement (for example at the wafer level in the case where the DUTs are all arranged on a wafer). In this case, the DUTs to be tested are contacted within a matrix arrangement of any desired size such that the test parameter of each DUT can be detected once within the resulting row and a second time within the resulting column from the respective parallel measurement.

The DUTs 102 could be tested row by row in a sufficiently large matrix arrangement with high angular resolution. Each time the angular resolution is increased, however, the potential and the advantage of a parallel test decrease, for which reason the rotation of the matrix is restricted to a minimum in accordance with various embodiments.

In the case of a plurality of parallel tests in accordance with different grouping of DUTs (e.g. in accordance with rows or columns of the matrix arrangement), the information obtained for each test comprises an information vector with discrete pull-in voltages for all present and even absent devices within the measured grouping (e.g. matrix row).

In accordance with one embodiment, a rotation of 90° is carried out, that is to say in the case of an arrangement of the DUTs 102 in matrix form firstly, for example, a parallel measurement of all the rows is carried out and a subsequent parallel measurement of all the columns of the matrix structure is carried out. From the evaluation of the test parameters (in this case the pull-in voltages) lying outside the specification for the rows and columns, the defective DUTs can be determined by means of correlation with a considerable saving of test time.

The rotation can be achieved for example by using a needle card which only contacts a partial vector of the DUT matrix and realizes the respective parallel measurement of the rows by an offset of the needle card. In this case, the rotation can be achieved by means of a specific chip design which, depending on the type of DUTs, provides a contacting possibility rotated by 90°, but this requires additional outlay.

A further variant is the contacting of all DUTs 102 of the matrix using corresponding needle cards (e.g. needle cards for "single touchdown") and a selection of the required DUTs of the row/column parallel measurement by means of switchable relays or comparable switching components, depending on the type of DUTs, e.g. in the needle card or some other part of the measuring adapter 104. In this case, the needle card can also be adapted to the form of the arrangement of the DUTs, for example to the form of a wafer on which the DUTs are arranged.

By way of example, if a matrix, on account of its rectangular form, can be led to the edge regions of a round wafer only with cutbacks and thus with temporal losses, then with specific adaptation of the needle card and a corresponding interconnection of all the contacted DUTs 102 (in other words grouping of the DUTs 102 in groups for which common measurements are carried out) any arbitrary form of an edge region can be contacted without losses. The manner of contacting and the realization can be evaluated and adapted to particular requirements of existing test installations, depending on the functioning of the DUTs 102.

An example of detection and identification of defective DUTs among the sixteen DUTs [1 . . . 16] is described below.

Figure 9:
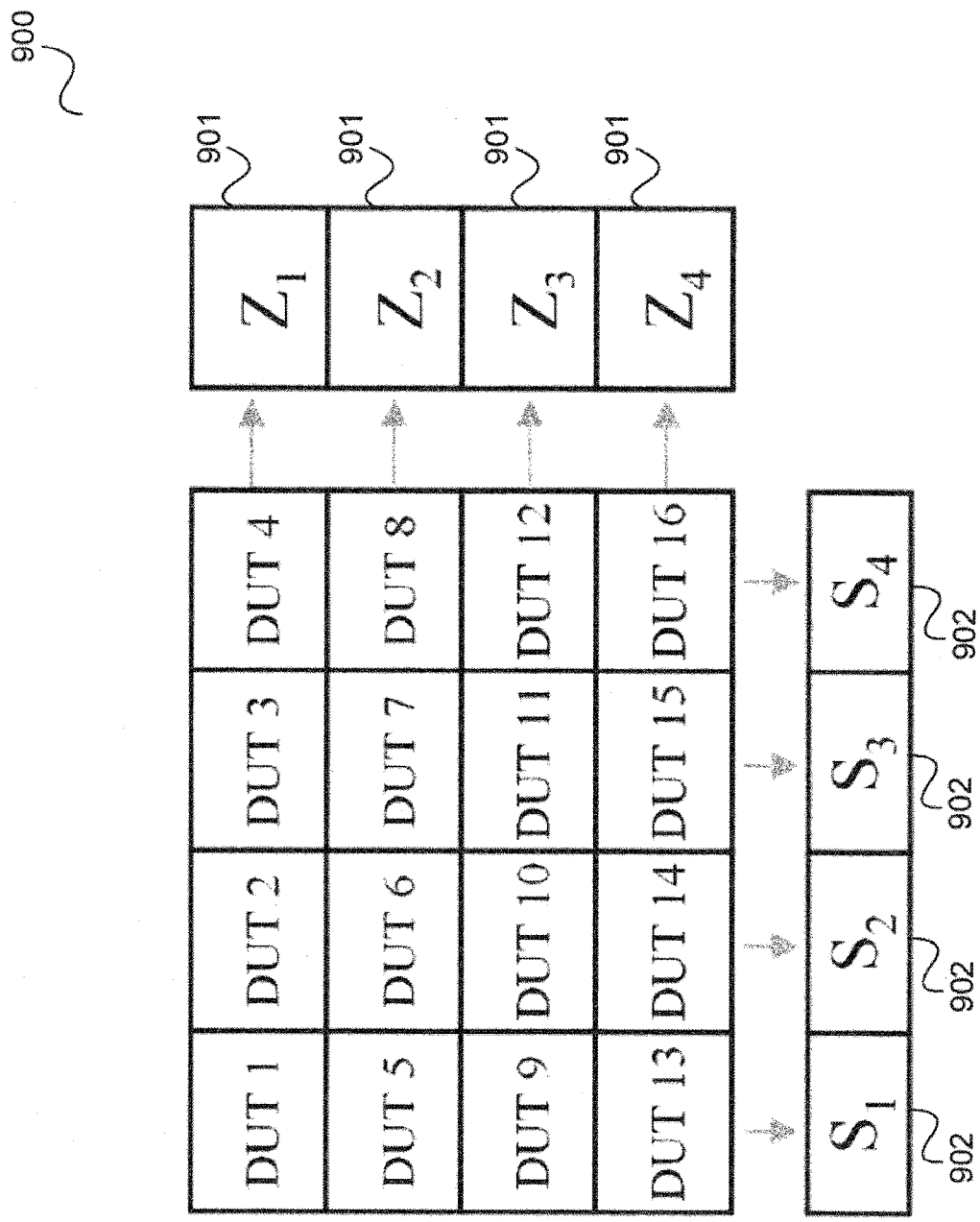
FIG. 9 shows a DUT matrix.

The sixteen DUTs are grouped for this purpose for example in accordance with a matrix in rows and columns, as illustrated in FIG. 9.

FIG. 9 shows a DUT matrix 900 in accordance with various embodiments.

The DUTs are arranged for example in the form of the illustrated DUT matrix 900 on a wafer. However, they can also be arranged differently and merely be grouped in four rows 901, which are designated by Z1 to Z4, and columns 902, which are designated by S1 to S4.

Figure 10:
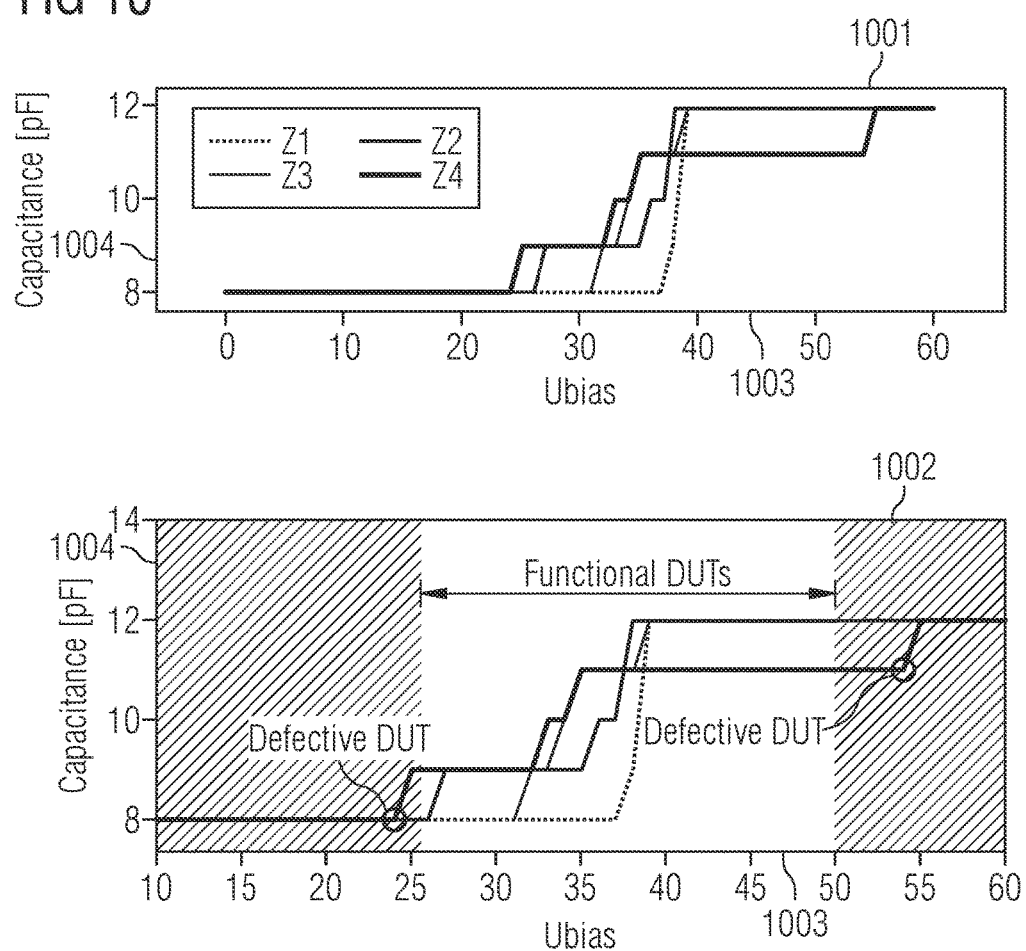
FIG. 10 shows capacitance diagrams.
Figure 11:
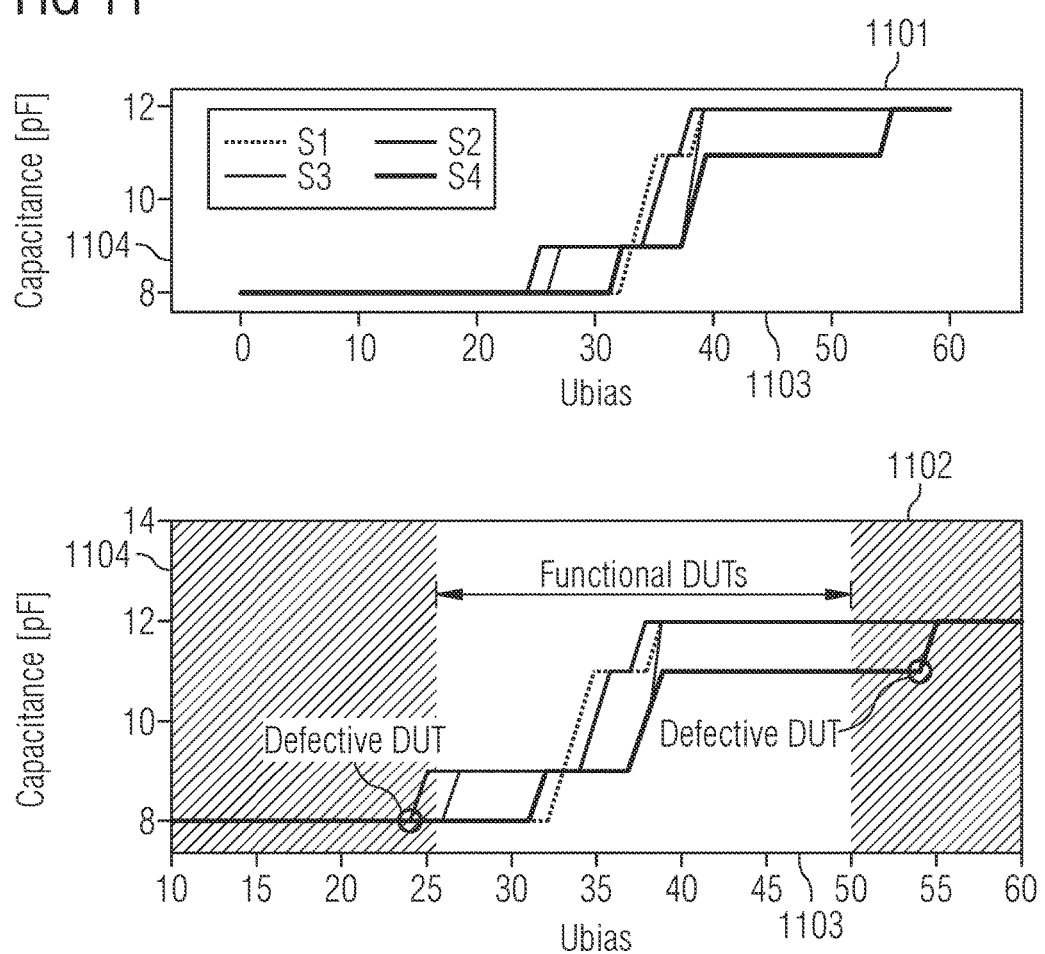
FIG. 11 shows capacitance diagrams.

The results of the row measurements and of the column measurements are illustrated in FIG. 10 and FIG. 11.

FIG. 10 shows capacitance diagrams 1001, 1002.

In the capacitance diagrams 1001, 1002, the voltage at the components increases in each case from left to right along a respective voltage axis 1003, and the capacitance increases along a respective capacitance axis 1004.

The first capacitance diagram 1001 shows the capacitance profile of the parallel measurement for each row over the entire voltage range of [0 . . . 60] volts.

The second capacitance diagram 1002 shows the capacitance profile of the parallel measurement for each row in the range relevant to pull-in detection.

FIG. 11 shows capacitance diagrams 1101, 1102.

In the capacitance diagrams 1101, 1102, the voltage at the components increases in each case from left to right along a respective voltage axis 1103, and the capacitance increases along a respective capacitance axis 1104.

The first capacitance diagram 1101 shows the capacitance profile of the parallel measurement for each column over the entire voltage range of [0 . . . 60] volts.

The second capacitance diagram 1102 shows the capacitance profile of the parallel measurement for each column in the range relevant to pull-in detection.

Figure 12:
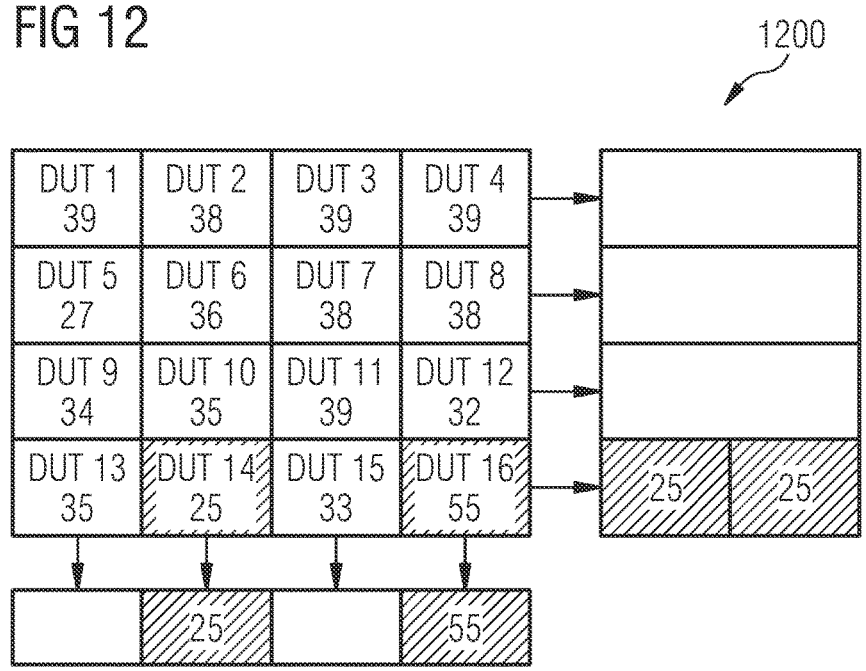
FIG. 12 shows a DUT matrix with the pull-in voltages of MEMS sensors that are assumed in one example.

FIG. 12 shows a DUT matrix 1200 with the pull-in voltages assumed in this example according to the arrangement of the DUTs which is illustrated in FIG. 9. It is assumed in this example that a defective DUT having a pull-in voltage of 25 volts is present in row Z4, column S1 and a defective DUT having a pull-in voltage of 55 volts is present in row Z4, column. S4.

Accordingly, the measurement of row Z4 gives rise to two pull-in voltages lying outside the specification, namely 25 volts and 55 volts, the measurement of column S2 gives rise to one pull-in voltage lying outside the specification, namely 25 volts, and the measurement of column S4 gives rise to one pull-in voltage lying outside the specification, namely 55 volts.

Figure 13:
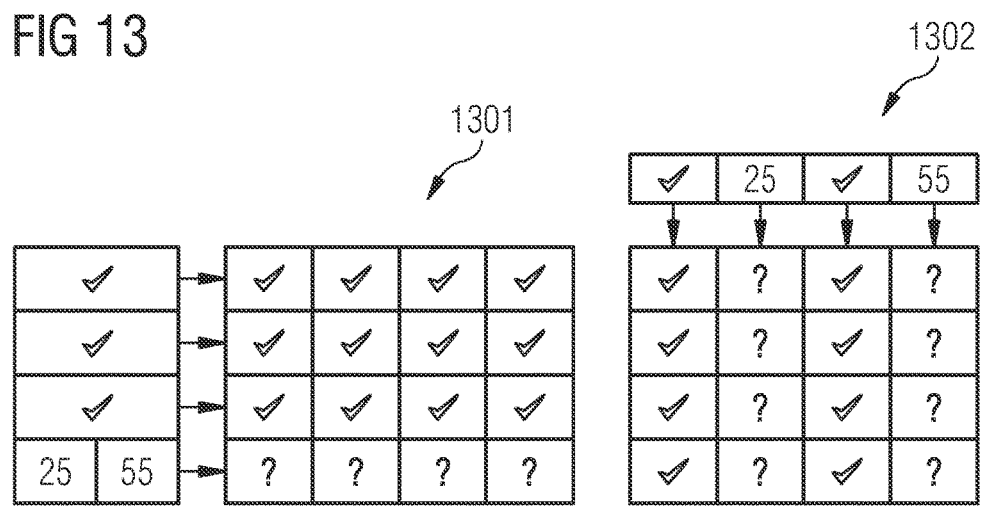
FIG. 13 illustrates the reconstruction of the position of defective DUTs.

FIG. 13 illustrates the reconstruction of the position of the defective DUTs.

A first matrix 1301 corresponding to the arrangement of the DUTs from FIG. 9 identifies what information can be obtained from the row measurements. Since two pull-in voltages outside the specification occur only for the measurement of row Z4, it can be concluded that two defective DUTs are situated in row Z4, wherein the exact localization within the row Z4 is not possible on the basis of the row measurements (identified by question marks for the DUT positions of the fourth row). For the other DUTs it can be concluded that they are not defective (identified by ticks through the DUT positions of the rows Z1, Z2, Z3).

A second matrix 1302 corresponding to the arrangement of the DUTs from FIG. 9 identifies what information can be obtained from the column measurements. Since a pull-in voltage outside the specification occurs in each case only for the measurements of column S2 and column S4, it can be concluded that one defective DUT is situated in column S2 and one defective DUT is situated in column S4, wherein the exact localization within the columns S2 and S4 is not possible on the basis of the column measurements (identified by question marks for the DUT positions of the second column and the fourth column). For the other DUTs it can be concluded that they are not defective (identified by ticks through the DUT positions of the columns S1 and S3).

The exact position of the defective DUTs can be determined for example with the aid of a histogram (in this way also in an automated manner for a high number of DUTs 102).

Figure 14:
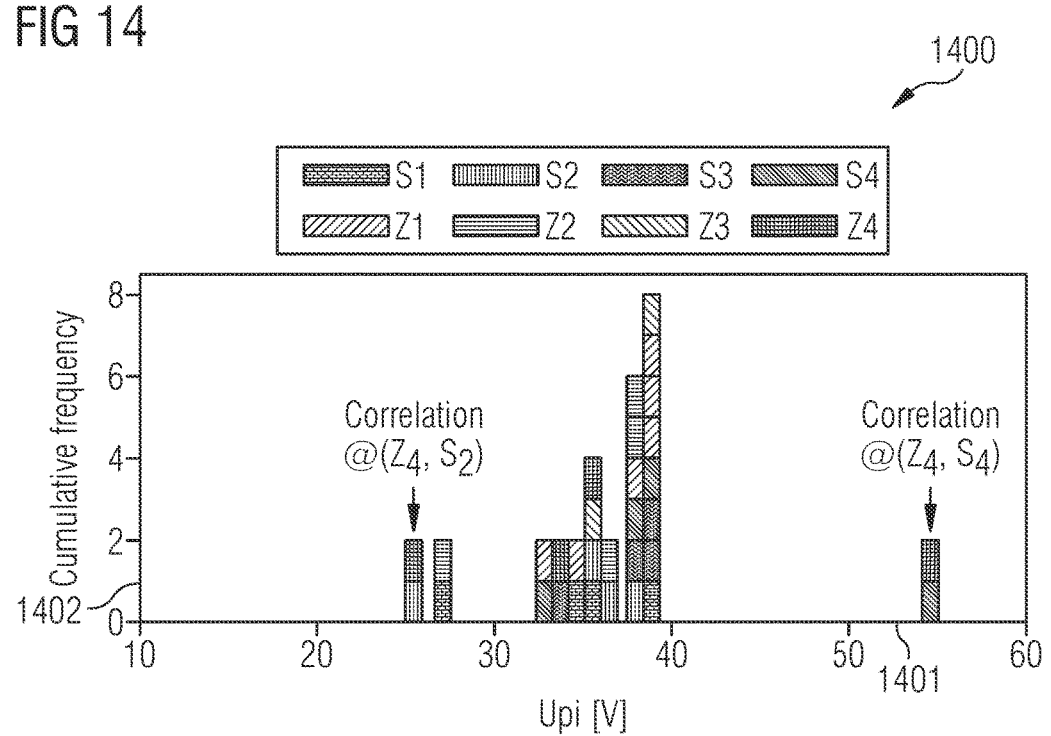
FIG. 14 shows a histogram.

FIG. 14 shows a histogram 1400 in accordance with various embodiments.

In the histogram 1400, increasing values of the pull-in voltage are plotted from left to right along a voltage axis 1401 and the frequency with which a specific pull-in voltage occurred during a row measurement or column measurement is plotted in an increasing manner along a frequency axis 1402, wherein each occurrence is identified by a block (with the width corresponding to the frequency 1) which is identified with the column or row to which it belongs (by the different filling of the respective block in FIG. 14).

Consequently, the occurrence of a pull-in voltage value for a row or a column is classified in different class intervals. The correlation of row and column for the value of the test parameter in a class outside the specification yields the exact position of the defective DUTs within the DUT matrix, such as is illustrated in FIG. 12.

The method described above for detecting and identifying defective components (or generally components having a predefined property) can generally be employed if a test parameter (the pull-in voltage in the above example) can be determined for example by distinct variation of the measurement curve of an electrical parameter (the capacitance as above), such that a detectable excursion results even for parallel measurements in the case of a defective DUT. A purely physical detection of defective devices is likewise possible, such that a constant difference between the individual rows/columns (with and without defective DUTs) can be identified for example in the case of a static measurement.

Depending on the type of DUTs it is possible to choose a different interconnection of the components for the analog parallel measurements. Since capacitive sensors are involved in the above example, a parallel connection of the DUTs is chosen in order to obtain the total capacitance from the parallel voltage and the sum of the currents. However, the procedure can also be applied to non-capacitive components. By way of example, an interconnection in series can be used for simultaneously measuring the cumulating voltages in the case of corresponding devices. In this case, the possibility of a device failure can be considered separately again. The exact design can be individually adapted to the respective requirements and fault records to be detected with regard to the type of DUTs. By way of example, the DUTs can be diodes, wherein the test parameter is the threshold voltage of the diodes, for example, and the tested property is, for example, that the threshold voltage lies within a specific range. In this case, the test parameter (i.e. the threshold voltage) is determined on the basis of a current jump at a specific voltage for example instead of on the basis of a capacitance jump (as in the above example for determining the pull-in voltage). Depending on the component and test parameter to be determined, it is also possible, for example, to use frequency jumps or phase jumps for determining the test parameter. A test parameter can for example also be a resonant frequency of a component, since said resonant frequency can yield a statement about the quality factor of the component.

Depending on the measurement resolution and configuration of the class interval for the reconstruction by means of a histogram, highly sensitive parameters can be assigned precisely.

As the proportion of defective DUTs increases, the probability of ambiguities increases.

Ambiguities occur in the case of identical parameter values in different rows and different columns, such that there is no longer a unique assignment to the position within the arrangement (e.g. the matrix).

By way of example, in the case of the example shown in FIG. 12, DUT 10 and DUT 13, as a result of an excessively low measurement resolution, yield the same test parameter of 35 volts, which leads to an ambiguity, as is illustrated in FIG. 15.

FIG. 15 shows DUT matrices 1501, 1502.

The first DUT matrix 1501, corresponding to the DUT matrix from FIG. 12, illustrates that the measurements for Z3, Z4, S1 and S2 in each case yield an occurrence of a pull-in voltage of 35 volts. From these measurement results it is not possible to determine at which of the four positions identified by question marks in the second DUT matrix 1502 the components having said pull-in voltage are situated.

A fourfold ambiguity arises in the case of the example shown in FIG. 12 analogously for the pull-in voltage of 39 volts, for which, according to column measurements and row measurements, components having this value are possible at six positions of the matrix (in each case in Z1 and Z3 in all columns apart from S2). A threefold ambiguity arises analogously for the pull-in voltage of 38 V, while no ambiguities occur for the rest of the values, which occur only once in the example in accordance with FIG. 12. Possible ambiguities can be read from the histogram 803.

For resolving an ambiguity in order to assign a test parameter value to the matching DUTs, an ambiguity can be resolved, if appropriate, using test parameter values without ambiguities by possible positions being unambiguously assigned to test parameter values and thus being ruled out. In the example in FIG. 15, for example, DUT9 and DUT 13 can be assigned unambiguous test parameter values and thus be ruled out as possible positions of the pull-in voltage with ambiguity.

Alternatively, additional measurements of individual components or parallel measurements, for example of a selected diagonal, can be used for this purpose in order to assign the test parameter values unambiguously to DUTs.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for testing a plurality of electronic components, the method comprising:
    subdividing the plurality of electronic components into a plurality of first groups;
    subdividing the plurality of electronic components into a plurality of second groups;
    wherein the plurality of electronic components are arranged in a manner corresponding to a matrix, and the plurality of first groups correspond to rows of the matrix and the plurality of second groups correspond to columns of the matrix;
    measuring, for each first group, an electrical parameter of an interconnection of the electronic components of the first group;
    measuring, for each second group, an electrical parameter of an interconnection of the electronic components of the second group; and
    determining which electronic components of the plurality of electronic components have a predefined property, on the basis of the result of the measurement of the electrical parameter for the first groups and on the basis of the result of the measurement of the electrical parameter for the second groups.

2. The method as claimed in claim 1,
    wherein determining which electronic components of the plurality of electronic components have the predefined property comprises:

determining, for each first group, on the basis of the result of the measurement of the electrical parameter for the first group, whether the first group contains an electronic component having the predefined property, and, when the first group contains the electronic component having the predefined property, identifying the electronic component of the first group having the predefined property on the basis of the result of the measurement of the electrical parameter for the second groups.

3. The method as claimed in claim 2,
wherein identifying the electronic component of the first group having the predefined property on the basis of the result of the measurement of the electrical parameter for the second groups comprises:
determining, for each second group, on the basis of the result of the measurement of the electrical parameter for the second group, whether the second group contains an electronic component having the predefined property, and
identifying the electronic component of the first group as the electronic component contained in the second group for which it was determined that the latter contains the electronic component having the predefined property.

4. The method as claimed in claim 1,
wherein the plurality of electronic components are subdivided completely into the plurality of first groups and completely into the plurality of second groups.

5. The method as claimed in claim 1,
wherein each first group of the plurality of first groups differs from each second group of the plurality of second groups.

6. The method as claimed in claim 1,
wherein each first group of the plurality of first groups has at most one component in common with each second group of the plurality of second groups.

7. The method as claimed in claim 1,
wherein each first group of the plurality of first groups has exactly one component in common with each second group of the plurality of second groups.

8. The method as claimed in claim 1,
wherein the interconnection is a parallel connection or a series connection.

9. The method as claimed in claim 1, further comprising:
measuring, for each first group, the profile of an electrical parameter of an interconnection of the electronic components of the first group depending on an electrical variable;
measuring, for each second group, the profile of an electrical parameter of an interconnection of the electronic components of the second group depending on an electrical variable; and
determining which electronic components of the plurality of electronic components have the predefined property, on the basis of the result of the measurement of the profile of the electrical parameter for the first groups and on the basis of the result of the measurement of the profile of the electrical parameter for the second groups.

10. The method as claimed in claim 1,
wherein determining which electronic components of the plurality of electronic components have the predefined property comprises:
determining a test parameter value; and
assigning the test parameter value to an electronic component.

11. The method as claimed in claim 10,
wherein the electronic component has the predefined property if the test parameter value assigned to the electronic component lies within a predefined range.

12. The method as claimed in claim 1,
wherein the electrical parameter measured for the first groups and the electrical parameter measured for the second groups are the same electrical parameter.

13. The method as claimed in claim 1,
wherein at least one of the electrical parameter measured for the first groups or the electrical parameter measured for the second groups is: a resistance of the interconnection, a capacitance of the interconnection, an inductance of the interconnection, an impedance of the interconnection, a phase shift of the interconnection, a frequency shift of the interconnection, an output voltage of the interconnection, an output current of the interconnection, or a power of the interconnection.

14. The method as claimed in claim 10,
wherein the test parameter value is the value of: a pull-in voltage, a threshold voltage, or a resonant frequency.

15. The method as claimed in claim 1,
wherein the predefined property is that the electronic component fulfills a predefined functional specification.

16. The method as claimed in claim 1, further comprising:
subdividing the plurality of electronic components into a plurality of further groups;
measuring, for each further group, an electrical parameter of an interconnection of the components of the further group; and
determining which electronic components of the plurality of electronic components have the predefined property, on the basis of the result of the measurement of the electrical parameter for the first groups, on the basis of the result of the measurement of the electrical parameter for the second groups and on the basis of the result of the measurement of the electrical parameter for the further groups.

17. A measuring arrangement, comprising:
a plurality of electronic components to be measured,
a measuring device configured
to measure for each first group, in accordance with a subdivision of the plurality of electronic components into a plurality of first groups, an electrical parameter of an interconnection of the electronic components of the first group; and
to measure for each second group, in accordance with a subdivision of the plurality of electronic components into a plurality of second groups, an electrical parameter of an interconnection of the electronic components of the second group;
wherein the plurality of electronic components are arranged in a manner corresponding to a matrix, and the plurality of first groups correspond to rows of the matrix and the plurality of second groups correspond to columns of the matrix;
a processing device designed to determine, on the basis of the result of the measurement of the electrical parameter for the first groups and on the basis of the result of the measurement of the electrical parameter for the second groups, which electronic components of the plurality of electronic components have a predefined property.

18. The measuring arrangement as claimed in claim 17,
wherein the measuring device is furthermore designed to measure, for each further group in accordance with a subdivision of the plurality of electronic components into a plurality of further groups, an electrical parameter of an interconnection of the components of the further group, and wherein the processing device is designed to determine, on the basis of the result of the measurement of the electrical parameter for the first groups, on the basis of the result of the measurement of the electrical parameter for the second groups and on the basis of the result of the measurement of the electrical parameter for the further groups, which electronic components of the plurality of electronic components have the predefined property.

19. The measuring arrangement of claim 17, wherein at least one of the electrical parameter measured for the first groups or the electrical parameter measured for the second groups is: a resistance of the interconnection, a capacitance of the interconnection, an inductance of the interconnection, an impedance of the interconnection, a phase shift of the interconnection, a frequency shift of the interconnection, an output voltage of the interconnection, an output current of the interconnection, or a power of the interconnection.

20. The measuring arrangement of claim 17, wherein the processing device is configured to determine which electronic components of the plurality of electronic components have the predefined property by:
  determining a test parameter value; and
  assigning the test parameter value to an electronic component;
  wherein the test parameter value is one of: a pull-in voltage, a threshold voltage, or a resonant frequency.

* * * * *